United States Patent
Ballance et al.

(10) Patent No.: US 6,395,363 B1
(45) Date of Patent: *May 28, 2002

(54) SLOPED SUBSTRATE SUPPORT

(75) Inventors: David S. Ballance, Cupertino; Benjamin Bierman, Milpitas; Robert M. Haney, Palo Alto; David W. LaCourt, San Rafael, all of CA (US)

(73) Assignee: Applied Materials, Inc., Santa Clara, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/743,308

(22) Filed: Nov. 5, 1996

(51) Int. Cl.[7] .............................................. C23C 16/00
(52) U.S. Cl. ..................... 428/64.1; 118/500; 118/728; 118/729; 118/730; 428/66.2; 428/66.5; 428/66.6; 428/66.7; 428/446; 428/447; 428/454; 428/698
(58) Field of Search ............................... 428/64.1, 66.6, 428/66.2, 66.5, 66.7, 446, 447, 454, 698; 211/41.18, 134; 118/730, 728, 729, 500

(56) References Cited

U.S. PATENT DOCUMENTS

| | | | |
|---|---|---|---|
| 698,031 A | * 4/1902 | Leslie ......................... 428/66.6 |
| 1,850,684 A | * 3/1932 | Nathan ........................ 428/66.6 |
| 3,622,427 A | * 11/1971 | Kelly .......................... 428/66.6 |
| 5,155,336 A | 10/1992 | Gronet et al. ................ 219/411 |
| 5,169,684 A | 12/1992 | Takagi ....................... 427/248.1 |
| 5,228,501 A | * 7/1993 | Tepman ...................... 165/80.1 |
| 5,429,498 A | 7/1995 | Okase et al. ................. 432/152 |
| 5,458,688 A | 10/1995 | Watanabe .................... 118/724 |
| 5,474,612 A | 12/1995 | Sato et al. ................... 118/725 |
| 5,482,559 A | 1/1996 | Imai et al. ................... 118/728 |
| 5,660,472 A | * 8/1997 | Peuse .......................... 374/128 |
| 5,678,989 A | 10/1997 | Okase ......................... 432/241 |
| 5,755,511 A | 5/1998 | Peuse et al. ................. 374/128 |
| 5,820,367 A | 10/1998 | Osawa ........................ 432/253 |
| 5,820,686 A | 10/1998 | Moore ......................... 118/730 |
| 5,848,842 A | 12/1998 | Peuse et al. ................... 374/1 |
| 5,848,889 A | 12/1998 | Tietz et al. .................. 432/258 |
| 5,884,412 A | 3/1999 | Tietz et al. .................... 34/58 |

OTHER PUBLICATIONS

Ballance, et al., U.S. Patent Application Serial No. 08/685,493, entitled, Semiconductor Wafer Support Graded Thermal Mass, filed Jul. 24, 1996.

* cited by examiner

Primary Examiner—Nasser Ahmad
(74) Attorney, Agent, or Firm—Pennie & Edmonds LLP

(57) ABSTRACT

A substrate support comprising a shelf having a surface sloped at an angle such that the support contacts the substrate substantially at an edge portion of the substrate. The angle of the shelf is greater than an angle of the edge portion of the substrate. The surface of the shelf may be machined or polished to improve its smoothness. The substrate support thereby reduces the effect and severity of scratches on the substrate caused by the support. As a result, the substrate support improves substrate yield.

18 Claims, 4 Drawing Sheets

SLOPED SUBSTRATE SUPPORT

BACKGROUND OF THE INVENTION

This invention relates to a support for a substrate disposed in a semiconductor processing chamber.

In many semiconductor device manufacturing processes, the required high levels of device performance, yield, and process repeatability can only be achieved if the substrate (e.g., a semiconductor wafer) remains relatively free of defects during processing of the substrate.

For example, consider rapid thermal processing (RTP), which is used for several different fabrication processes, including rapid thermal annealing (RTA), rapid thermal cleaning (RTC), rapid thermal chemical vapor deposition (RTCVD), rapid thermal oxidation (RTO), and rapid thermal nitridation (RTN).

There is a trend in these processes to increase substrate size so as to increase the number of devices which can be fabricated simultaneously. If substrate thickness is constant, the mass of the substrate is proportional to the square of its radius or edge length.

In susceptor systems, the substrate is supported by being placed on a susceptor support. Thus, the amount of support is proportional to the surface area of the substrate. In susceptorless systems, the substrate is usually only supported around its perimeter with an edge ring.

We have discovered, however, that the edge ring has a tendency to impart a localized ring of scratches around the perimeter of the bottom surface of the substrate, which is explained as follows. A substrate tends to sag where it is not supported by the edge ring, i.e., in areas away from its edge, causing the substrate to assume a curved shape. Exposure of the substrate to high temperatures makes the substrate more susceptible to sag, thus increasing its curvature.

Because of its curvature, the edge of the substrate assumes a slight angle from the horizontal. For instance, the edge of a 12-inch (300 mm) diameter substrate may be about 150 $\mu$m higher than its center at room temperature, thereby causing the edge of the substrate to assume an angle of about 0.1 degrees from the horizontal. Due to this angle, the substrate does not rest flat on the surface of the edge ring but instead contacts the ring's inside edge. This condition is illustrated in FIG. 1 for a substrate 10 and an edge ring 20. As a result, edge ring tends to scratch the bottom surface of the substrate.

Larger, e.g., 12-inch (300 mm) substrates are especially susceptible to scratches for two reasons. First, larger substrates are heavier and more highly curved when supported at their edge, causing the substrate to contact the edge ring with greater force. Second, larger substrates are typically provided with backside surfaces that are highly polished, which tend to show scratches more readily than unpolished surfaces.

A ridge, or "edge crown", present on the inside edge of the edge ring was also found to scratch the substrate. The edge crown, which is formed when the edge ring is coated with a layer of polysilicon, is composed of excess polysilicon that preferentially deposits on the inside edge of the edge ring. The edge ring is coated with a layer of polysilicon to render it opaque in the frequency range used for temperature measurements of the substrate, thereby improving the accuracy of the temperature measurement.

Scratches on the surface of a substrate are undesirable because they increase the susceptibility of the substrate to slip. Slip is a defect in the crystalline structure of the substrate which destroys any devices through which it may pass, thereby reducing the yield of the substrate. More particularly, the presence of scratches on a substrate causes slip to occur in the substrate at a lower temperature than if no scratches were present. In other words, the presence of scratches makes a substrate less robust and less able to tolerate high temperatures. Scratches also increase the susceptibility of a substrate to slip under rapidly varying temperature conditions. Scratches are therefore a particularly significant problem for substrates processed in RTP chambers, where temperatures typically exceed 1100° C. and are subject to rapid change.

In addition to increasing the susceptibility of a substrate to slip, scratches also introduce undesirable cosmetic imperfections in the substrate. Furthermore, scratches may generate stray particles which may contaminate a device fabrication process, thereby decreasing yield.

Therefore, an object of the present invention is to provide a support for a substrate that minimizes the effect of scratches on the yield of a substrate.

Another object of the present invention is to provide a support for a substrate that minimizes its tendency to scratch the substrate.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the claims.

SUMMARY

The present invention is directed to a substrate support. The substrate support comprises a shelf, which may be annular, having a surface sloped at a first angle from the horizontal. The first angle is selected such that the substrate support contacts the substrate substantially at an edge portion of the substrate. The first angle of the shelf is greater than the angle of the edge portion of the substrate. For instance, the first angle may range from 1–10 degrees. The substrate support is provided with a sloped surface to shift the point at which it contacts the substrate towards the edge of the substrate, thereby causing scratches to be formed only near the edge of the substrate where they do not affect yield.

The surface of the shelf, viewed in cross-section, may be either planar, concave or convex. Furthermore, the cross-sectional shape of the surface may be spherical, parabolic, hyperbolic, or some other empirically derived shape.

The shelf may include a beveled portion, which may be annular, disposed on its inner edge. The beveled portion has a surface sloped at a second angle that is greater than the first angle of the shelf. The beveled portion is provided to prevent the substrate from contacting the ridge formed on the inner edge of the edge ring, thereby preventing the ridge from scratching the substrate.

The present invention may include a plurality of materials. The substrate support may be composed of silicon carbide. The substrate support may further include at least one coating disposed on a surface of the support. In one embodiment, the coating is a layer of polysilicon. In another embodiment, the coating is a layer of silicon nitride. In yet another embodiment, the coating does not cover the annular shelf.

The present invention may also include a plurality of surface finishes. A surface of the annular shelf may be machined or polished. Alternatively, a surface of the coating may be machined or polished.

Advantages of the present invention include the following. First, the present invention shifts the region where scratches are formed substantially to the edge of the substrate. Since the edge of the substrate contains no devices, the scratches do not adversely affect yield. Second, the present invention reduces the tendency of the support to scratch the substrate surface, thereby increasing the temperature at which the substrate may be processed without the occurrence of slip. As a result, substrates of up to 12 inches in diameter or more may be processed at the high temperatures necessary for such processes as RTP with satisfactory yield.

BRIEF DESCRIPTION OF THE DRAWINGS

The accompanying drawings, which are incorporated in and constitute a part of the specification, schematically illustrate an embodiment of the invention and, together with the general description given below, serve to explain the principles of the invention.

DESCRIPTION OF THE PREFERRED EMBODIMENT(S)

Figure 1:
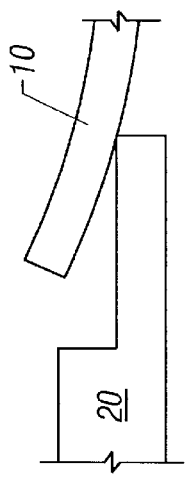
FIG. 1 is an enlarged cross-sectional side view of a prior art edge ring and a substrate.
Figure 2:
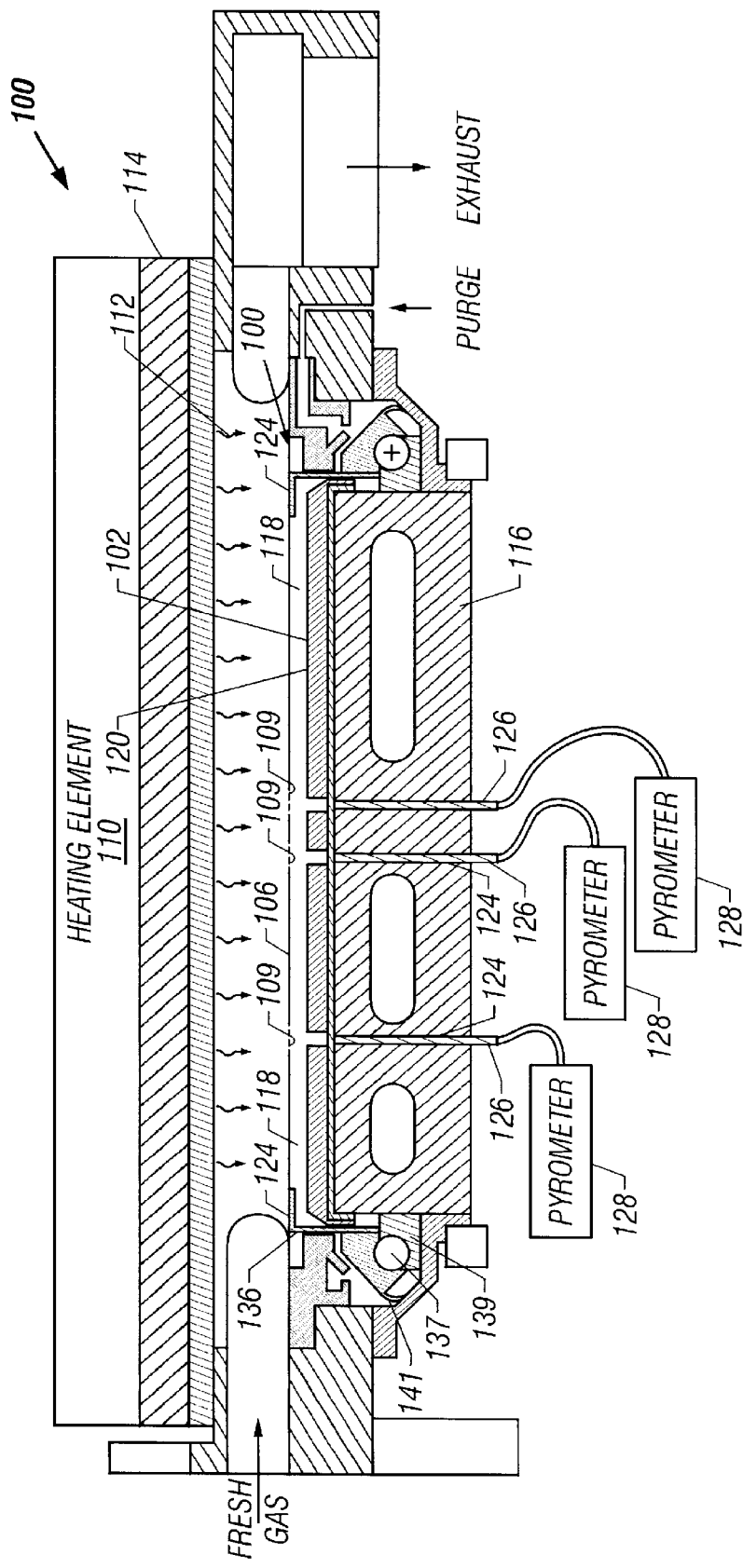
FIG. 2 is a cross-sectional side view of an RTP system in accordance with the present invention.

An RTP system in accordance with the present invention is shown in FIG. 2. This system is described in further detail in co-pending U.S. patent application Ser. No. 08/641,477, entitled "METHOD AND APPARATUS FOR MEASURING SUBSTRATE TEMPERATURES", filed on May 1, 1996, which is incorporated herein by reference.

The RTP system shown in FIG. 2 includes a processing chamber 100 for processing a disk-shaped, twelve-inch (300 mm) diameter silicon substrate 106. The substrate 106 is mounted inside the chamber on a substrate support structure 108 and is heated by a heating element 110 located directly above the substrate. The heating element 110 generates radiation 112 which enters the processing chamber 100 through a water-cooled quartz window assembly 114 which is approximately one inch (2.5 cm) above the substrate. Beneath substrate 106 is a reflector 102 which is mounted on a water-cooled, stainless steel base 116. Reflector 102 may be made of aluminum and has a highly reflective surface coating 120. The underside of substrate 106 and the top of reflector 102 form a reflecting cavity 118 for enhancing the effective emissivity of the substrate, thereby improving the accuracy of temperature measurement.

The temperatures at localized regions 109 of substrate 106 are measured by a plurality of temperature probes 126 and pyrometers 128. The temperature probes are distributed at varying distances from the center of substrate 106.

During thermal processing, support structure 108 is rotated at about 90 revolutions per minute. Thus, each probe actually samples the temperature profile of a corresponding annular ring area on the substrate. The support structure which rotates the substrate includes an edge ring 134 which contacts the substrate around the substrate's outer perimeter, thereby leaving all of the underside of the substrate exposed except for a small annular region about the outer perimeter.

Edge ring 134 rests on a rotatable tubular quartz cylinder 136 that is coated with silicon to render it opaque in the frequency range of pyrometers 128. The silicon coating on the quartz cylinder acts as a baffle to block out radiation from external sources that might confound the temperature measurements. The bottom of the quartz cylinder is held by an annular upper bearing race 141 which rests on a plurality of ball bearings 137 that are, in turn, held within an stationary, annular, lower bearing race 139.

Figure 3:
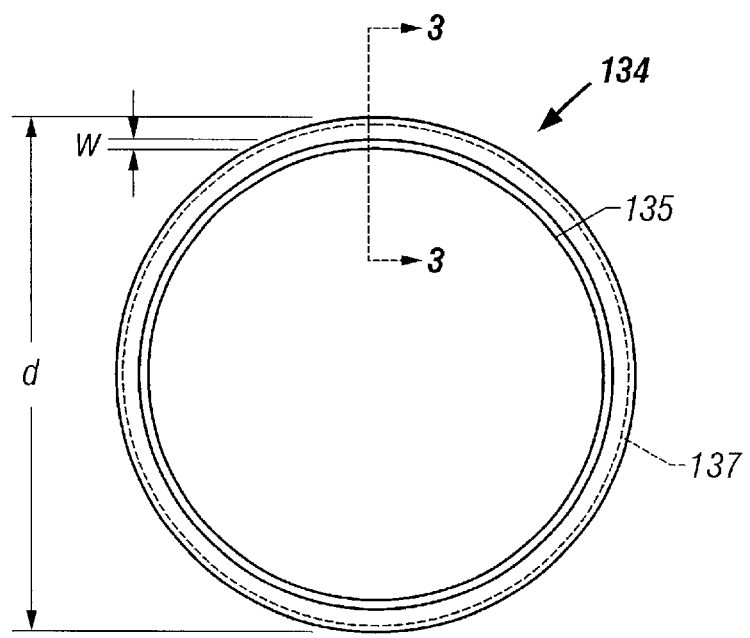
FIG. 3 is a plan view of an edge ring in accordance with the present invention.
Figure 4:
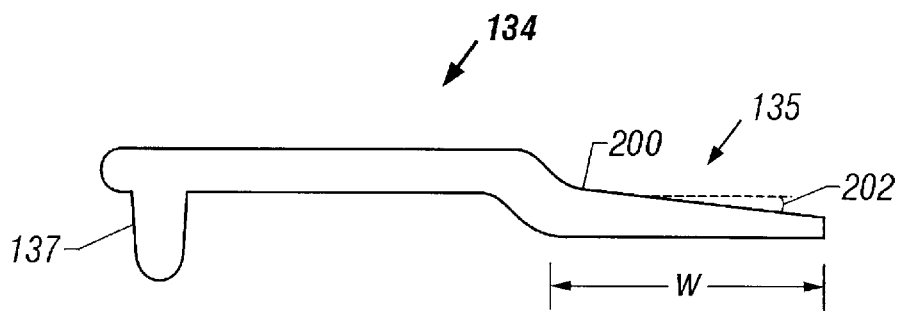
FIG. 4 is a cross-sectional side view of the edge ring of FIG. 3 along line 4—4.

Referring to FIGS. 3 and 4, edge ring 134 includes an annular shelf 135 upon which the edge of substrate 106 rests. A surface 200 of annular shelf 135 is sloped at an angle 202 from the horizontal.

For a 12 inch (300 mm) substrate, edge ring 134 may have a diameter (d) of approximately 13.2 inches (335 mm). Annular shelf 135 may have a radial width (w) of approximately 1.3 inches (4.1 mm). The radial overlap between substrate 106 and edge ring 134 may be approximately 2.7 mm if substrate 106 is placed in a centered position on annular shelf 135.

Figure 5:
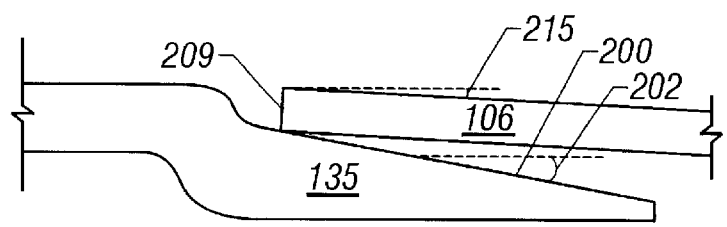
FIG. 5 is an enlarged cross-sectional side view of the edge ring of FIG. 3 along line 4—4.

Referring to FIG. 5, angle 202 of annular shelf 135 is selected such that edge ring 134 contacts substrate 106 substantially at an edge portion 209 of the substrate. Since edge portion 209 of substrate 106 does not typically contain devices, scratches formed near edge portion 209 are less likely to affect the yield of the substrate. Angle 202 may be greater than or equal to an angle 215 of edge portion 209 of substrate 106. Because the curvature of substrate 106 increases as higher temperatures, angle 202 may be selected to be greater than or equal to angle 215 at the highest temperature to which substrate 106 is exposed. Angle 202 may, for instance, range from 1–10 degrees from the horizontal. In one embodiment, angle 202 is 5.6 degrees from the horizontal.

Figure 6:
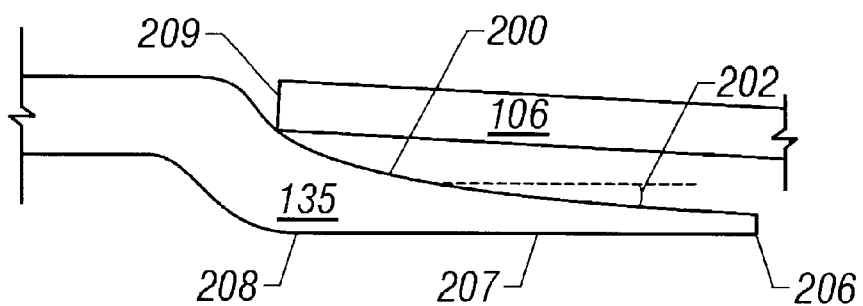
FIG. 6 is an enlarged cross-sectional side view of an edge ring in accordance with the present invention having an annular shelf with a curved surface.

Surface 200 of annular shelf 135 may assume one of a variety of shapes. As shown in FIGS. 4 and 5, surface 200 may have a cross-section that is substantially planar. Alternatively, surface 200 may have a cross-section that is concave, as shown in FIG. 6, or convex (not shown). Furthermore, the cross-sectional shape of surface 200 may be spherical, parabolic, hyperbolic, or some other empirically derived shape. If surface 200 is concave or convex, angle 202 varies radially across the shelf. Referring to FIG. 6, angle 202 may be 1 degree at an inner edge 206 of annular shelf 135, 3 degrees at a middle region 207 and 5 degrees at an outer edge 208.

Figure 7:
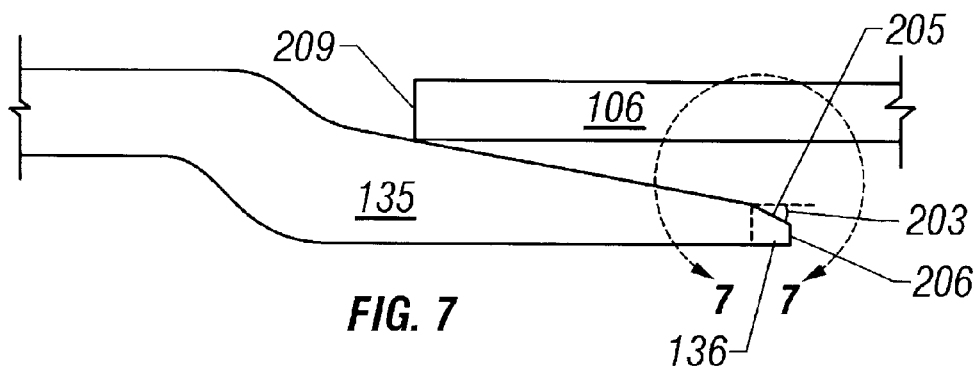
FIG. 7 is an enlarged cross-sectional side view of an edge ring in accordance with the present invention having a beveled portion.

Referring to FIG. 7, annular shelf 135 may include a beveled portion 136 disposed on its inner edge 206. A surface 205 of beveled portion 136 is sloped at an angle 203 from the horizontal.

Figure 8:
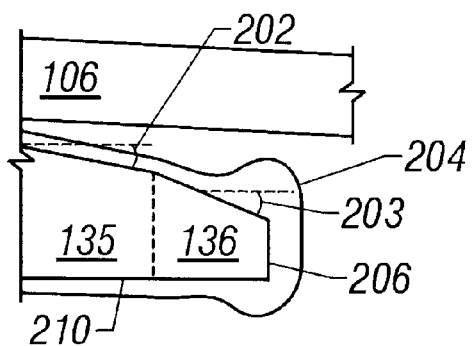
FIG. 8 is an enlarged cross-sectional side view of the edge ring of FIG. 7 along line 8—8, further including a layer of polysilicon.

Referring to FIG. 8, beveled portion 136 prevents a ridge 204 formed on inner edge 206 of the edge ring, as described below, from contacting and scratching substrate 106. Angle 203 is greater than angle 202 of annular shelf 135 and is selected to enable substrate 106 to clear ridge 204. For instance, angle 203 may be 5–10 degrees from the horizontal.

Referring again to FIGS. 3 and 4, edge ring 134 may also include an annular rib 137. Rib 137 provides structural support for edge ring 134.

Edge ring 134 may be made of silicon carbide (SiC). However, SiC is transparent to radiation in the frequency range used for temperature measurements of the substrate. As a result, edge ring 134 may transmit stray radiation that may affect the accuracy of the temperature measurement. Therefore, edge ring 134 may be coated with a layer of polysilicon to render it opaque to such radiation.

Figure 9:
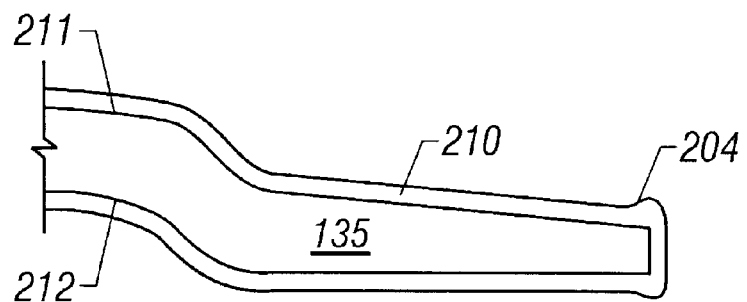
FIGS. 9–11 are enlarged cross-sectional side views of edge rings in accordance with the present invention having layers of polysilicon covering various surfaces of the rings.

Referring to FIG. 9, a polysilicon layer 210 may be formed on a top surface 211 and a bottom surface 212 of edge ring 134. Polysilicon layer 210 may be formed by a deposition process using two masks, one for each surface. The thickness of polysilicon layer 210 may be about 100 $\mu$m.

The deposition of polysilicon layer 210 on edge ring 134, however, may result in the formation of ridge 204, as shown in FIGS. 8 and 9. Ridge 204 forms during the deposition of polysilicon layer 210 as a result of the preferential deposition of polysilicon at inner edge 206 of edge ring 134. As noted earlier, ridge 204 may scratch substrate 106.

Figure 10:
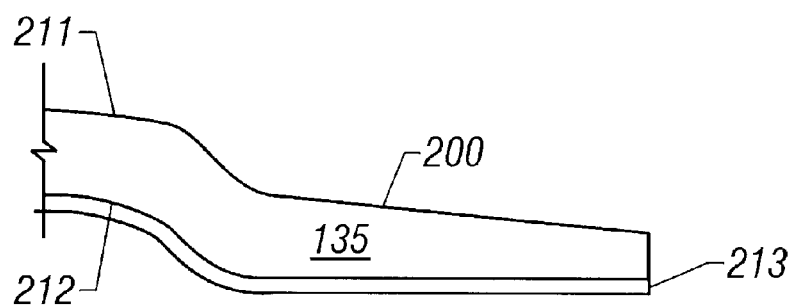

To prevent the scratching from occurring, a polysilicon layer 213 may be disposed solely on bottom surface 212 of edge ring 134 as shown in FIG. 10. Polysilicon layer 213 may be deposited using a single mask. This embodiment provides substrate 106 with a contact surface to edge ring 134 composed of SiC rather than polysilicon.

Figure 11:
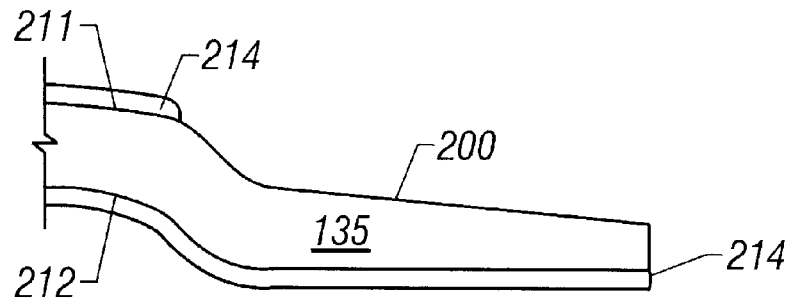

Alternatively, as shown in FIG. 11, a polysilicon layer 214 may be formed on both top and bottom surfaces 211 and 212, but with the polysilicon layer removed from surface 200 of annular shelf 135. Polysilicon layer 214 may be removed with a single mask using a dry hydrogen chloride (HCl) etch. This embodiment prevents ridge 204 from scratching substrate 106. It also provides substrate 106 with a contact surface to edge ring 134 composed of SiC rather than polysilicon.

If edge ring 134 is coated with either of polysilicon layers 210, 213 or 214, the edge ring may further include a layer of silicon nitride ($Si_3Ni_4$) disposed on the polysilicon layer (not shown). The silicon nitride layer acts as a diffusion barrier to prevent metal impurities that may be present in the polysilicon layer from contaminating substrate 106.

Referring again to FIG. 4, surface 200 of annular shelf 135 may be machined or polished to increase its smoothness, thereby reducing its tendency to scratch substrate 106. If machined, surface 200 may have a surface roughness of about 4–16 microinches. If polished, surface 200 may have a surface roughness of about 0.4–4 microinches. For comparison purposes, an unfinished surface 200 has a surface roughness of about 40–100 microinches. If surface 200 is coated with polysilicon layer 210, the polysilicon layer may be similarly machined or polished.

Surface 200 may also be provided with an optical quality polish. Polished in this manner, surface 200 may have a surface roughness of about 0.02–0.2 microinches (5–50 angstroms). The polish may be performed either by hand or by machine.

The present invention has been described in terms of a preferred embodiment. The invention, however, is not limited to the embodiment depicted and described. Rather the scope of the invention is defined by the appended claims.

What is claimed is:

1. A support for a substrate in a semiconductor processing chamber, comprising:
   a shelf to support the substrate in the semiconductor processing chamber, said shelf having an upper portion having a first radial width and a lower portion located radially inwardly of said upper portion and having a second radial width less than said first radial width, said lower portion forming a support surface downwardly sloped towards a center of said support at an angle from the horizontal; and
   wherein the angle of said support surface is selected such that said support surface contacts the bottom of the substrate at an angle that is between about 1 degree and about 10 degrees from the horizontal during processing.

2. The substrate support of claim 1, wherein said processing chamber is a thermal processing chamber.

3. A substrate support to support a substrate in a semiconductor processing chamber, comprising:
   a shelf to support the substrate in the processing chamber, said shelf having a support surface downwardly sloped towards a center of the substrate support at a first angle from the horizontal; and
   wherein the first angle of said support surface is selected such that said support surface contacts the bottom of the substrate at an angle that is between about 1 degree and about 10 degrees from the horizontal during processing.

4. The substrate support of claim 3, wherein said support is disposed in processing chamber is a thermal processing chamber.

5. The substrate support of claim 3, wherein the first angle of said support surface varies radially across said shelf.

6. The substrate support of claim 5, wherein the cross-sectional shape of said support surface is concave or convex.

7. The substrate support of claim 3, wherein said shelf includes an annular beveled portion disposed on an inner edge of said shelf, said annular beveled portion having a surface sloped at a second angle from the horizontal, the second angle being greater than the first angle of said support surface.

8. The substrate support of claim 3, further comprising at least one coating disposed on a portion of said shelf.

9. The substrate support of claim 8, wherein said coating is a layer of silicon nitride.

10. The substrate support of claim 3, wherein the support surface of said shelf is polished.

11. The substrate support of claim 8, wherein a surface of said coating is polished.

12. The substrate support of claims 10 or 11, wherein said polished surface has a roughness of between about 0.02 microinches and about 4 microinches.

13. A substrate support to support a substrate in a semiconductor processing chamber, comprising:
   a shelf to support a substrate in the processing chamber, said shelf having a support surface sloped towards a center of the substrate support at a first angle from the horizontal, such that said support surface contacts and supports said substrate during the heating process of the substrate generally within the volume formed by the shelf and at an edge portion of said substrate; and
   wherein the first angle of said support surface is selected such that said support surface contacts the bottom of the substrate at an angle that is between about 1 degree and about 10 degrees from the horizontal during processing.

14. The substrate support of claim 13, wherein said shelf includes an annular beveled portion disposed on its inside edge, said annular beveled portion having a surface sloped at a second angle from the horizontal, the second angle being greater than the first angle.

15. A substrate support to support a substrate in a semiconductor processing chamber, comprising:
- a shelf having a support surface to support a substrate in the processing chamber during heating of the substrate, the support surface sloped at an angle from the horizontal; and
- wherein the angle of said surface is selected such that said support surface contact the bottom of the substrate at an angle that is between about 1 degree and about 10 degrees from the horizontal during processing.

16. The substrate support of claim 15 wherein the angle varies radially across the support surface.

17. The substrate support of claim 15 wherein the cross-sectional shape of the support surface is planar, concave or convex.

18. A substrate support to support a substrate in a semiconductor processing chamber, comprising:
- a shelf to support the substrate in the processing chamber, said shelf having a support surface downwardly sloped towards a center of the substrate support at a first angle from the horizontal, the substrate further comprising at least one coating disposed on a portion of said shelf; and
- wherein the first angle of said support surface is selected such that said support surface contacts the bottom of the substrate at an angle substantially different from zero degrees.

* * * * *